United States Patent [19]
Delarue et al.

[11] Patent Number: 5,109,724
[45] Date of Patent: May 5, 1992

[54] MICROMANIPULATOR

[75] Inventors: François Delarue, Champigny-sur-Marne; Michel Girand, Villiers-sur-Marne; Manuel Montero, Le Perreux, all of France

[73] Assignee: U.S. Philips Corporation, New York, N.Y.

[21] Appl. No.: 492,681

[22] Filed: Mar. 12, 1990

[30] Foreign Application Priority Data

Mar. 10, 1989 [FR] France .................. 89 03164

[51] Int. Cl.$^5$ .................. B25J 7/00; G05G 11/00
[52] U.S. Cl. .................. 74/479; 74/18.1; 74/89.17; 475/9
[58] Field of Search .................. 74/479, 18.1, 89.17; 250/440.1, 442.1; 475/9

[56] References Cited

U.S. PATENT DOCUMENTS

| | | | |
|---|---|---|---|
| 3,131,917 | 5/1964 | Gessner et al. | 74/479 |
| 3,521,056 | 7/1970 | Suzuki | 250/442.1 |
| 3,638,015 | 1/1972 | Browning et al. | 250/442.1 X |
| 3,702,399 | 11/1972 | Lucas | 250/442.1 X |
| 3,778,621 | 12/1973 | Mikajiri | 250/442.1 |
| 4,538,068 | 8/1985 | Haney et al. | 250/443.1 |
| 4,587,431 | 5/1986 | Uemura | 250/442.1 |

FOREIGN PATENT DOCUMENTS

| | | | |
|---|---|---|---|
| 243235 | 2/1987 | Fed. Rep. of Germany | |
| 58-102522 | 6/1983 | Japan | 250/442.1 |
| 156837 | 5/1978 | Netherlands | 74/479 |

OTHER PUBLICATIONS

"A Novel Ultra-High Vacuum Manipulator with Six Degrees of Freedom" by O. Auciello, C. Lulich, E. V. Alonso & R. A. Baragiola, Nuclear Instruments and Methods 147 (1977) 349-351.

*Primary Examiner*—Allan D. Herrmann
*Attorney, Agent, or Firm*—Brian J. Wieghaus

[57] ABSTRACT

A micromanipulator for the displacement of a sample carrier according to different degrees of freedom by means of displacement members (26) fixed to elastic bellows ($21_1$, $21_2$, $21_3$, 23), which participate in the transmission of movement through a wall (37). At least one rotary movement of the sample carrier is transmitted through the said wall by means of a transmission pin ($11_1$, $11_2$) movable in translation, which is fixed to a said bellows ($21_1$, $21_2$). At least one translatory movement of the sample carrier can also be transmitted by at least one respective transmission pin ($11_3$) movable in translation. The transmission pins operate in the translation mode parallel to a single direction. The sample carrier can perform on the one hand a translatory displacement and on the other hand a rotary displacement according to a rotation in its plane and according to a rotation by inclination of the said plane.

22 Claims, 3 Drawing Sheets

MICROMANIPULATOR

BACKGROUND OF THE INVENTION

The invention relates to a micromanipulator for the displacement of a sample carrier according to different degrees of freedom by means of displacement members mounted on elastic bellows, which participate in the transmission of the movements through a wall.

Such a manipulator can be used in a vacuum or in an ultrahigh vacuum or in controlled atmospheres.

A micromanipulator of this kind is described in U.S. Pat. No. 4,587,431. It permits of ensuring in an ultrahigh vacuum the positioning of samples before a beam. The displacement can be effected according to three orthogonal translatory movements and according to two rotations: the rotation of the sample itself with respect to the axis perpendicular to its plane and a rotation of inclination of this plane with respect to the beam. In order to obtain the transmission of the commands between the zone at atmospheric pressure and the zone in an ultrahigh vacuum, elastic bellows are used. For the transmission of the translatory movements of the sample, the bellows concerned are moved by transmission means, which perform a translatory displacement. For the transmission of the rotary movements of the sample, the bellows concerned are moved by rotation means, which in the zone in an ultrahigh vacuum are transmitted by means of a so-called "pig-tail device".

However, such a micromanipulator is voluminous. Moreover, the bellows transmitting the rotary movements operate in the torsional mode, which can be detrimental to their operation. In fact, such repeated actions render the bellows brittle, which can then present microleaks or larger leaks, which results in that the lifetime of these bellows is limited.

The problem to be solved by the invention is to provide a micromanipulator which is as compact as possible, which offers several degrees of freedom in translation and/or in rotation with high amplitudes and a high precision and which transmits the initial commands while avoiding to exert torsional forces on the bellows. It must ensure a very stable position of the sample and it must be readily controllable from the outside in order to permit a programmable operation.

SUMMARY OF THE INVENTION

The solution of this problem consists in that at least one rotary movement of the sample carrier is transmitted through the said wall by means of a transmission pin, movable in translation, which is fixed to a said bellows. The transmission pin is connected to a mounting and displacement means which converts the translation of the transmission pin into rotation of the carrier.

The rotation of the sample carrier can take place about an axis perpendicular to the plane of the surface of the sample carrier intended to receive the sample. The rotation can also be effected in that this plane is inclined with respect to an initial position.

The mounting and displacement means can also cause the sample carrier to be subjected to translatory displacements either in the plane or perpendicular to the said surface of the sample carrier.

The micromanipulator is intended in the first place to position a sample in an ultrahigh vacuum before an analysis apparatus, such as an analyser by spectroscopy of the photoelectrons originating from X-rays (X-ray photoelectron spectroscopy XPS). However, it is possible to use it with other types of analysis apparatus or for other environments, for example protected atmospheres. It permits of working with samples of large dimensions (i.e. of large mass for this type of application) due to the large displacement amplitudes permitted by it. It is possible to position a point situated at the surface of the sample with respect to an analysis beam and to cause the incidence angle to vary at this point. A rotation of the sample itself can also be obtained.

BRIEF DESCRIPTION OF THE DRAWINGS

In order that the invention may be readily carried out, it will now be described more fully, by way of example, with reference to the accompanying drawing, in which.

DESCRIPTION OF THE PREFERRED EMBODIMENTS

Figure 1:
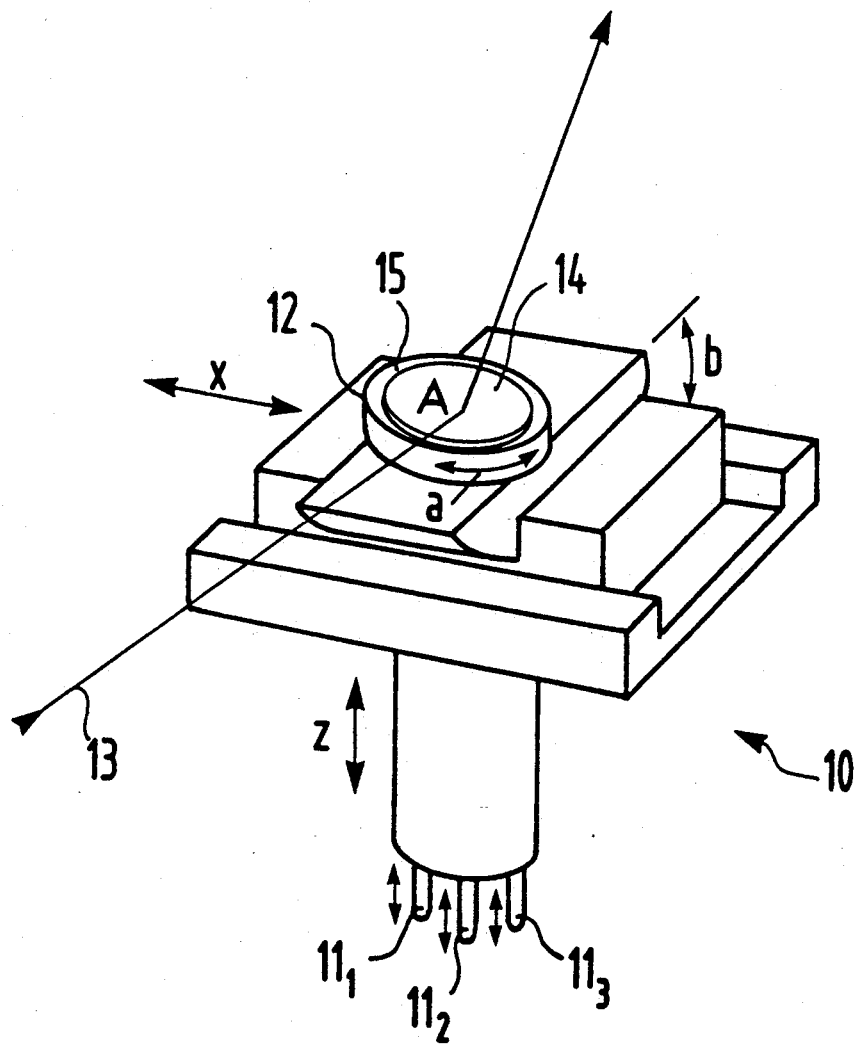
FIG. 1 shows a schematic diagram of a micromanipulator and of a sample carrier having two rotary displacements and two translatory displacements.

FIG. 1 is a strongly simplified schematic diagram of a micromanipulator 10, given by way of example, having 4 degrees of freedom. Under the action of transmission pins $11_1$, $11_2$, $11_3$, the displacement members will carry out a translation X, a rotation a and a rotation b of the sample carrier 12 with respect to an incident analysis beam 13. Through translation of bellows 23 by a screw/nut mechanism 87, the carrier 12 also performs a translation Z. A sample 14 is placed on the surface 15 of the sample carrier 12. The sample carrier can be subjected to a rotation a about an axis perpendicular to the surface 15. Likewise, the sample carrier can be subjected to a rotation b, which inclines the surface 15 with respect to the incident beam 13. The two rotations are effected about the impact point A of the beam 13 when the point A is located at the crossing of the two axes of rotation.

Figure 2:
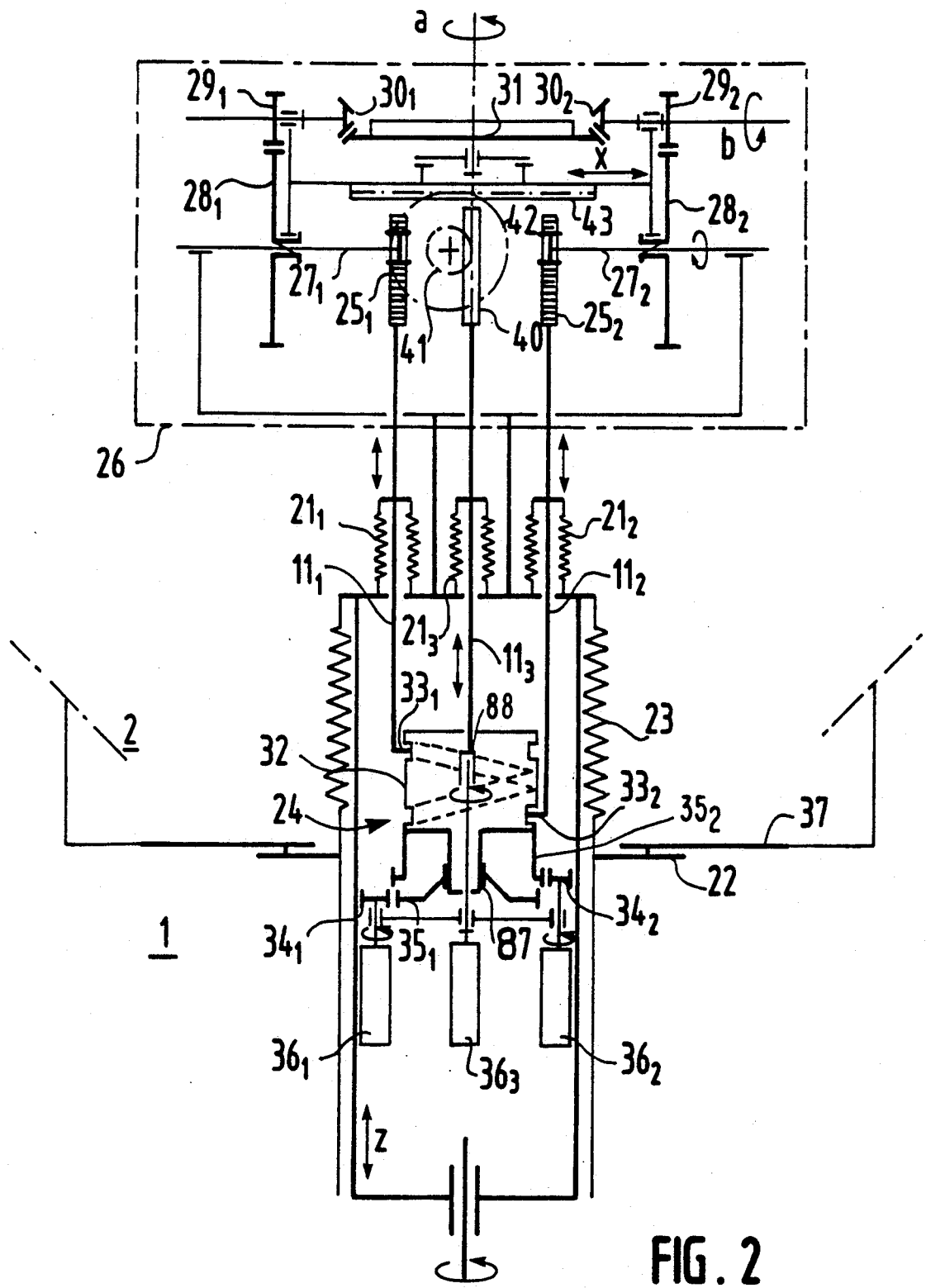
FIG. 2 shows a schematic diagram of a first embodiment of a micromanipulator according to the invention having two rotary displacements and two translatory displacements.

FIG. 2 shows a schematic diagram of a first embodiment of a micromanipulator according to the invention, which permits of ensuring the 4 degrees of freedom indicated in FIG. 1. The transmission pins $11_1$, $11_2$, $11_3$ transmit translatory movements while causing three elastic bellows $21_1$, $21_2$, $21_3$ to participate. These bellows are intended to ensure vacuum or gas tightness between two zones 1, 2 isolated from each other.

In the present case, an ultrahigh vacuum apparatus is concerned, the zone 1 being placed in the ambient atmosphere and the zone 2 being placed in an ultrahigh vacuum. The separation is effected by the bellows $21_1$, $21_2$, $21_3$ and by a clamp 22 fixed on a wall 37. Another bellows 23, whose function will be described hereinafter, can also participate in the isolation of the two zones.

The two rotary movements a and b are ensured by the pins $11_1$ and $11_2$ and the translatory movement is ensured by the pin $11_3$. The pins are translated by translation means 24 and they act upon the sample carrier by means of a mounting and displacement means 26.

In order to carry out the two rotations, the pins $11_1$ and $11_2$ act upon first and second gear trains which include toothed racks $25_1$ and $25_2$, respectively. Each toothed rack $25_1$, $25_2$ takes along by means of a shaft $27_1$, $27_2$ cylindrical pinions $28_1$, $28_2$, $29_1$, $29_2$ and a conical carrier pinion $30_1$, $30_2$ coupled to carrier 31. Thus, in order to transform the translations of the transmission pins into a rotation of the sample carrier, the mounting and displacement means includes two gear trains, each comprising a toothed rack coupled to a cylindrical pinion provided with a shaft, which takes along at least one carrier pinion, which sets the sample carrier into rotation.

The two conical pinions $30_1$, $30_2$ can rotate either in the same sense or in opposite senses and can act simultaneously upon the carrier 31.

This double possibility is permitted by subjecting the transmission pins $11_1$, $11_2$ to translations either in the same direction or in opposite directions.

Thus, the transmission pins can be displaced simultaneously in opposite directions so that the pinions meshed with the sample carrier rotate in different directions of rotation, thus producing a rotation of the sample carrier about an axis perpendicular to its plane.

Likewise, the transmission pins can be displaced simultaneously in the same direction so that the pinions meshed with the sample carrier rotate in the same direction of rotation, thus producing a rotation of the sample carrier while inclining its plane with respect to an initial position. The senses of rotation of the pinions are described with respect to a given direction.

The translations of the transmission pins are imposed by translation means 24. In order to cause the translation means $11_1$, $11_2$ to be displaced in opposite senses, the translation means 24 comprise a double-grooved screw 32 having an inverted pitch. The pins $11_1$, $11_2$ have at their end each a bolt $33_1$, $33_2$, which is displaced in one and in the other groove, respectively. Thus, by the rotation in one or in the other direction of the screw 32, it is possible to set the sample carrier into rotation in one or in the other direction. The screw 32 is set into rotation by the pinions $34_2$, $35_2$ controlled in rotation by the motor $36_2$.

In order to obtain the displacement of the pins $11_1$ and $11_2$ in the same direction, it is sufficient to translate the screw 32 by means of the screw 87 and the pinions $35_1$ and $34_1$. A motor $36_1$ can set the pinion $34_1$ into rotation.

Thus, in order to produce two rotations of the sample carrier by means of rotational inputs, the micromanipulator comprises two elastic bellows, of which each transmission pin is set into translation by translation means comprising for the inverted translation a first bolt integral with the end of the first pin, which is displaced in one of the grooves of a double-grooved screw having an inverted pitch, and a second bolt integral with the end of the second pin, which is displaced in the other groove, the screw being set into rotation by a rotation means, while for the translation of the pins in the same sense there is provided a screw/nut system integral with the screw 32 and displacing it axially. The amplitude of the displacement of the pins is determined by the ends of the two grooves.

Thus, not a single interference occurs between the two rotations a and b.

The translatory movement of the surface of the sample carrier in its plane in the direction X is obtained by means of the transmission pin $11_3$. It displaces a toothed rack 40, which acts upon a cylindrical pinion 41 having the same axis as a cylindrical pinion 42, which acts upon a toothed rack 43.

Thus, in order to transform the translations of the transmission pins into translations of the sample carrier in a different manner, the displacement members comprise for an arbitrary translation a toothed rack coupled to a cylindrical pinion coaxial with another cylindrical pinion, which takes along another toothed rack, which causes a translatory displacement of the sample carrier.

It is possible to double the number of elements for translating the sample carrier in two different directions X and Y. The transmission pins ensuring the translations of the sample carrier are displaced in translation parallel to the one direction.

The transmission pin $11_3$ can be caused to perform a translatory displacement by a rotation means, such as motor $36_3$. The rotation is transformed into axial transmission of pin $11_3$ by a rotation means of a mechanism comprising a movable screw/nut system 88.

It is possible that the sample carrier is subjected either to rotary displacements or to translatory displacements.

It is also possible to combine these two types of displacement; for this purpose, the shafts $27_1$, $27_2$ are grooved so that the pinions $28_1$, $28_2$, $29_1$, $29_2$, $30_1$, $30_2$ and the platform 31 can slide along these shafts when the toothed rack 40 imposes a translatory movement on the sample carrier.

The displacement members can cause the sample carrier to be subjected to rotary displacements and to translatory displacements, the shaft transferring the rotation to the sample carrier being grooved to ensure that the pinions taking along this carrier slide longitudinally along its periphery.

According to the schematic diagram shown in FIG. 1, a micromanipulator is obtained, for which the regulations of the rotations a and b are independent, that is to say that a slight modification of one of the regulations does not influence the other.

Figure 3:
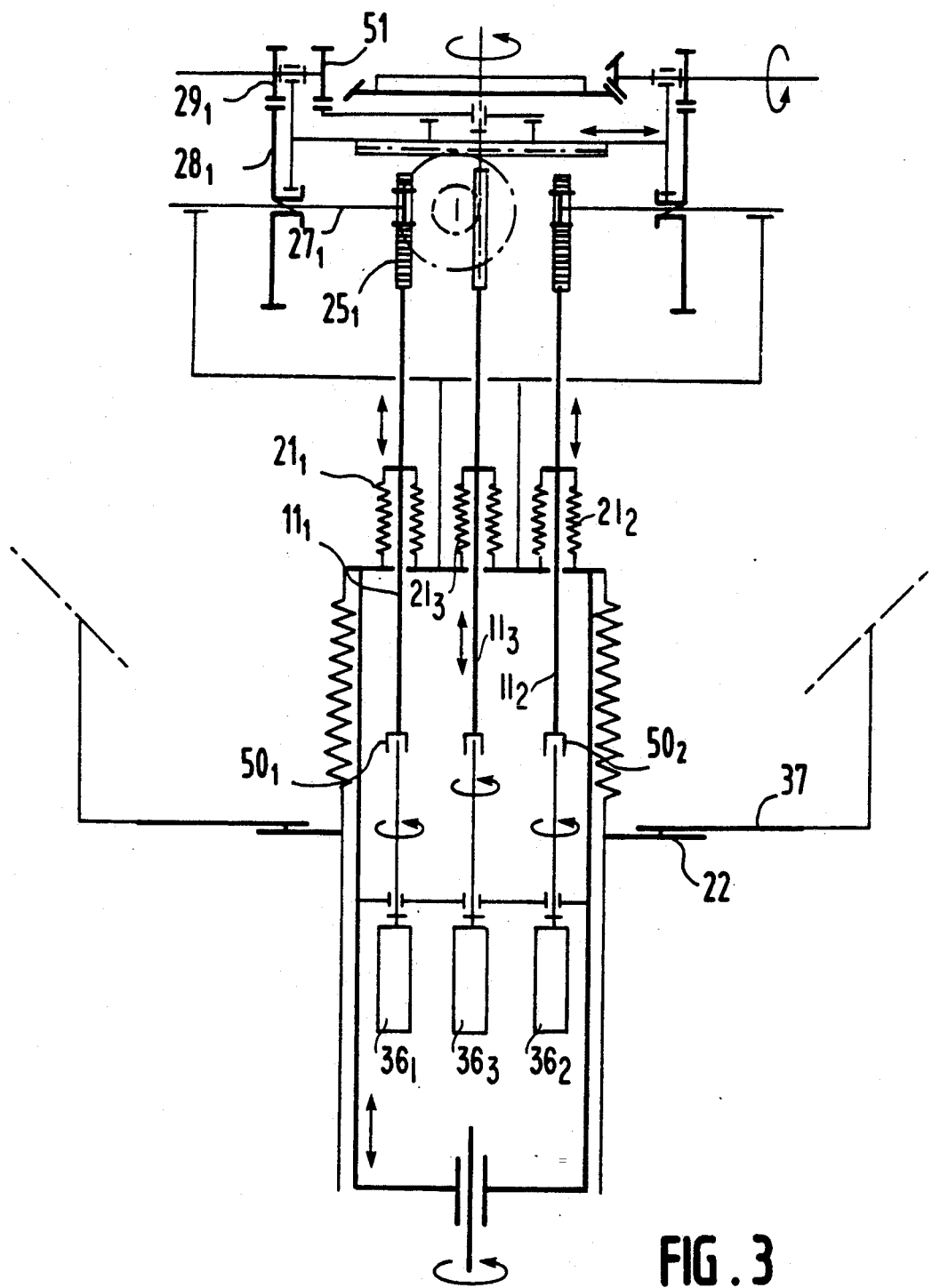
FIG. 3 shows a schematic diagram of a second embodiment of a micromanipulator with the same degrees of freedom as for FIG. 1.

According to FIG. 3, it is possible to obtain a simplified embodiment, in which this characteristic is not fully satisfied. In this case, a modification of one of the regulations of rotation necessitates to readjust the other rotation regulation. FIG. 3 exhibits all the characteristics of FIG. 2 except the following points solely relating to the two rotations.

Translation means now no longer comprise the screw 32. The pins $11_1$ and $11_2$ are individually controlled. For this purpose, they each have a mechanism comprising a movable screw/nut system $50_1$, $50_2$ to operate by means of initial rotational inputs from rotation means such as motors $36_1$, $36_2$, $36_3$.

The displacement members no longer comprise the conical pinion $30_1$ cooperating with the pinion $30_2$. In FIG. 3, the pinion $30_1$ is replaced by a straight pinion 51, which is taken along by the pinions $29_1$, $28_1$, the shaft $27_1$ and the toothed rack $25_1$.

In order to permit a displacement in the direction Z perpendicular (when it is not inclined) to the surface 15 (FIG. 1) of the sample carrier, it is possible to place three bellows $21_1$, $21_2$, $21_3$ on a bellows 23, which is displaced also by a translatory movement in the same direction. Thus, the assembly constituted by the mounting and displacement means 26, the bellows $21_1$, $21_2$, $21_3$, the transmission pins $11_1$, $11_2$, $11_3$ and the translation means 24 may be displaced as a whole in the direction Z.

The initial commands, which actuate the transmission pins $11_1$, $11_2$, $11_3$, can be translation commands. They can be produced by actuators.

Preferably, the translation means 24 are intended to produce a translatory movement of the transmission pins $11_1$, $11_2$, $11_3$ by means of initial rotational inputs, as has been described above.

In this case, the rotational inputs can be produced by motors. This permits a programming of the operation of the micromanipulator.

Such a micromanipulator is adapted to receive samples having a diameter of 50.8 mm with a rotation a in the plane varying from 0° to 360° with an accuracy of ±0.1°. The rotation b can be effected between −30° and 60° with an accuracy of ±0.1°. The translation X reaches ±12.5 mm with an accuracy of ±0.02 mm and the translation Z can reach 100 mm with an accuracy of ±5 μm. It is capable of withstanding temperatures up to about 150° C. The sample carrier can be electrically insulated by means of a ceramic plate fixed to the sample carrier 31. The axes of rotation are then defined accordingly.

We claim:

1. A micromanipulator for displacing a sample carrier, said micromanipulator having elastic bellow, mounting and displacement means for mounting said carrier for rotation and linear translation of said carrier, and linkage members extending through corresponding bellows in a sealed manner and cooperating with said mounting and displacement means such that movement of each linkage member affects a corresponding translation of rotation of said carrier, the improvement comprising:

a first of said linkage members being a first transmission pin moveable in axial translation, substantially without rotation with respect to its corresponding bellows, and coupled to said mounting and displacement means; and said mounting and displacement means being arranged for rotating said sample carrier about a first axis of rotation substantially parallel to said first transmission pin in response to axial translation of said first transmission pin.

2. A micromanipulator as claimed in claim 1 wherein said mounting and displacement means includes a gear train comprising a toothed rack engaged by said first transmission pin, a shaft coupled to said toothed rack, a cylindrical pinion fixed on said shaft, and a carrier pinion coupled to said carrier and meshing with said cylindrical pinion, said gear train being arranged such that axial translation of said transmission pin moves said toothed rack and affects rotation of said shaft, said cylindrical pinion, said carrier pinion, and said carrier.

3. A micromanipulator as claimed in claim 2, comprising a second transmission pin moveable in axial translation parallel to said first transmission pin, substantially without rotation with respect to its corresponding bellows, and coupled to said mounting and displacement means, said mounting and displacement means being arranged for affecting rotation of said sample carrier about said first axis of rotation and a second different axis of rotation in response to axial translation of said first and second transmission pins.

4. A micromanipulator as claimed in claim 3, wherein said mounting and displacement means comprises a second of said gear trains, the toothed rack of said second gear train being coupled with said second transmission pin.

5. A micromanipulator as claimed in claim 4, wherein said first and second gear trains are arranged such that, for equal and simultaneous translation of said transmission pins in the same direction, said carrier pinions meshed with said sample carrier rotate in the same sense of rotation, thus producing a rotation of the sample carrier to incline its plane with respect to an initial position.

6. A micromanipulator as claimed in claim 5, wherein said first and second gear trains are arranged such that, for equal and simultaneous transmission of said transmission pins in opposite directions, said carrier pinions meshed with said sample carrier rotate in different senses of rotation, thus producing a rotation of the sample carrier about an axis perpendicular to its plane.

7. A micromanipulator as claimed in claim 6, further comprising:

a double-grooved screw having two grooves with inverted pitches;

means for rotating said double-grooved screw; and said first and second transmission pins each having ends engaged in a respective screw groove, whereby rotation of said double-grooved screw causes translation of said transmission pins in opposite directions.

8. A micromanipulator as claimed in claim 7, further comprising a screw/nut mechanism coupled to said double grooved screw for axially translating said double-grooves screw and said first and second transmission pins in the same direction upon rotation of one of said screw and nut.

9. A micromanipulator as claimed in claim 8, wherein said mounting and displacement means, for causing a linear translation of said sample carrier, comprises a third said transmission pin, a toothed rack coupled to said third transmission pin, two fixedly coupled and coaxial cylindrical pinions, and another toothed rack coupled to said carrier, one of said coaxial pinions meshing with said toothed rack coupled to said third transmission pin and the other coaxial pinion meshing with said toothed rack coupled to said carrier, whereby linear translation of said third transmission pin causes rotation of said pinions and toothed racks and linear translation of said carrier.

10. A micromanipulator as claimed in claim 9, characterized in that said third transmission pin translates parallel to said first and second transmission pins.

11. A micromanipulator as claimed in claim 10, further comprising a movable screw/nut mechanism for converting rotational inputs into axial translation of a said transmission pin.

12. A micromanipulator as claimed in claim 11, characterized in that a translation actuator causes translation of a said transmission pin.

13. A micromanipulator as claimed in claim 12, characterized in that a motor provides rotation for at least one of said double-grooved screw and said screw/nut mechanism.

14. A micromanipulator as claimed in claim 4, wherein said first and second gear trains are arranged such that, for equal and simultaneous translation of said transmission pins in the same direction, said carrier pinions meshed with said sample carrier rotate in the same sense of rotation, producing a rotation of the sample carrier to incline its plane with respect to an initial position.

15. A micromanipulator as claimed in claim 14, wherein said first and second gear trains are arranged such that, for equal and simultaneous transmission of said transmission pins in opposite directions, said carrier pinions meshed with said sample carrier rotate in different senses of rotation, thus producing a rotation of the sample carrier about an axis perpendicular to its plane.

16. A micromanipulator as claimed in claim 3, wherein said mounting and displacement means, for causing a linear translation of said sample carrier, comprises a third said transmission pin, a toothed rack coupled to said third transmission pin, two fixedly coupled and coaxial cylindrical pinions, and another toothed rack coupled to said carrier, one of said coaxial pinions meshing with said toothed rack coupled to said third transmission pin and the other coaxial pinion meshing with said toothed rack coupled to said carrier, whereby linear translation of said third transmission pin causes rotation of said pinions and toothed racks and linear translation of said carrier.

17. A micromanipulator according to claim 9, wherein a pinion of said first and second gear trains coupled to said carrier is axially slidable on a corresponding shaft for following the linear translation of said carrier.

18. A micromanipulator as claimed in claim 10, further comprising translation means for translating each of said transmission pins, and a bellows on which said translation means is mounted, said bellows being displaceable for moving said translation means and said carrier parallel to said transmission pins.

19. A micromanipulator as claimed in claim 1, further comprising translation means for translating a said transmission pin, and a bellows on which said translation means is mounted, said bellows being displaceable for moving said translation means and said carrier parallel to said transmission pin.

20. A micromanipulator as claimed in claim 1, further comprising a movable screw/nut mechanism for converting rotational inputs into translation of said transmission pins.

21. A micromanipulator as claimed in claim 1, characterized in that a translation actuator causes translation of said transmission pin.

22. A micromanipulator as claimed in claim 1, characterized in that a motor provides rotation for at least one of said double-grooved screw or screw/nut mechanism.

* * * * *